(12) United States Patent
Kim

(10) Patent No.: US 12,464,899 B2
(45) Date of Patent: Nov. 4, 2025

(54) DISPLAY PANEL AND MANUFACTURING METHOD THEREOF

(71) Applicant: Samsung Display Co., Ltd., Yongin-si (KR)

(72) Inventor: Yongil Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 471 days.

(21) Appl. No.: 17/739,147

(22) Filed: May 8, 2022

(65) Prior Publication Data

US 2023/0045133 A1 Feb. 9, 2023

(30) Foreign Application Priority Data

Aug. 4, 2021 (KR) .................. 10-2021-0102662

(51) Int. Cl.
*H01L 27/32* (2006.01)
*H10K 50/115* (2023.01)
(Continued)

(52) U.S. Cl.
CPC ......... *H10K 59/122* (2023.02); *H10K 50/115* (2023.02); *H10K 50/16* (2023.02);
(Continued)

(58) Field of Classification Search
CPC .... H10K 50/115; H10K 50/16; H10K 50/171; H10K 59/1201; H10K 59/122
See application file for complete search history.

(56) References Cited

U.S. PATENT DOCUMENTS 7,898,169 B2  3/2011  Kim
8,552,416 B2  10/2013  Kim et al.
(Continued)

FOREIGN PATENT DOCUMENTS

JP  2021052095 A  4/2021
KR  10-1274068  6/2013
(Continued)

OTHER PUBLICATIONS

Liu, Yu, et al. "Highly Efficient All-Solution Processed Inverted Quantum Dots Based Light Emitting Diodes." ACS Nano, vol. 12, No. 2, 2018, pp. 1564-1570.
(Continued)

*Primary Examiner* — Jaehwan Oh
(74) *Attorney, Agent, or Firm* — Lerner David LLP

(57) ABSTRACT

A display panel includes light-emitting electrodes respectively disposed in first to third emission areas, first intermediate layers respectively disposed in the first to third emission areas and respectively overlapping the light-emitting electrodes, a bank layer covering an edge of each of the first intermediate layers and including openings respectively overlapping the first intermediate layers, a counter electrode disposed on the bank layer and covering the light-emitting electrodes, quantum dot light-emitting layers arranged below the counter electrode and respectively disposed in the first to third emission areas, and a second intermediate layer between the first intermediate layer in the first emission area and the quantum dot light-emitting layer in the first emission area. The second intermediate layer is disposed in an opening of the bank layer corresponding to the first emission area, the opening being one of the openings of the bank layer.

21 Claims, 8 Drawing Sheets

(51) Int. Cl.
  *H10K 50/16* (2023.01)
  *H10K 50/17* (2023.01)
  *H10K 59/122* (2023.01)
  *H10K 71/00* (2023.01)
  *H10K 59/12* (2023.01)
  *H10K 102/00* (2023.01)

(52) U.S. Cl.
  CPC ........... *H10K 50/171* (2023.02); *H10K 71/00* (2023.02); *H10K 59/1201* (2023.02); *H10K 2102/00* (2023.02)

(56) References Cited

U.S. PATENT DOCUMENTS

| | | | |
|---|---|---|---|
| 2012/0119201 A1* | 5/2012 | Ueno | H10K 50/17 257/E51.026 |
| 2018/0151817 A1 | 5/2018 | Cho et al. | |
| 2020/0161594 A1* | 5/2020 | Kondo | H10K 50/13 |
| 2020/0295290 A1* | 9/2020 | Tsujimura | H10K 50/155 |
| 2021/0005834 A1 | 1/2021 | Lee et al. | |
| 2021/0028384 A1* | 1/2021 | Liang | C09K 11/02 |
| 2021/0098727 A1 | 4/2021 | Won et al. | |
| 2021/0104581 A1* | 4/2021 | Fukuoka | H10K 50/852 |
| 2021/0104708 A1* | 4/2021 | Fukuoka | H10K 71/00 |
| 2021/0111364 A1 | 4/2021 | Sakamoto et al. | |
| 2022/0209166 A1* | 6/2022 | Ueta | H10K 50/82 |
| 2022/0235238 A1* | 7/2022 | Levermore | C09K 11/664 |
| 2022/0278297 A1* | 9/2022 | Heo | H10K 50/115 |
| 2022/0310774 A1* | 9/2022 | Osako | H10K 59/1201 |
| 2022/0328781 A1* | 10/2022 | Guo | C09K 11/54 |
| 2023/0080877 A1* | 3/2023 | Yamamoto | C09K 11/883 257/40 |
| 2023/0303918 A1* | 9/2023 | Yaguchi | H05B 33/14 |

FOREIGN PATENT DOCUMENTS

| | | |
|---|---|---|
| KR | 10-1350658 | 1/2014 |
| KR | 10-2018-0059363 | 6/2018 |
| KR | 10-2021-0004748 | 1/2021 |
| KR | 10-2021-0039177 | 4/2021 |
| WO | 2020/245592 | 12/2020 |

OTHER PUBLICATIONS

Wang, Yu-Lin, et al. "Materials and Process Development for Znmgo/Zno Light-Emitting Diodes." IEEE Journal of Selected Topics in Quantum Electronics, vol. 14, No. 4, 2008, pp. 1048-1052.
QLED (light-emitting device includes quantum dots).

* cited by examiner

US 12,464,899 B2

DISPLAY PANEL AND MANUFACTURING METHOD THEREOF

CROSS-REFERENCE TO RELATED APPLICATIONS

This application claims priority to and the benefit of Korean Patent Application No. 10-2021-0102662, filed Aug. 4, 2021, which is hereby incorporated by reference for all purposes as if fully set forth herein.

BACKGROUND

Field

One or more embodiments generally relate to display panels and manufacturing methods of display panels, and more particularly to, display panels including a quantum dot light-emitting layer and manufacturing methods of display panels including a quantum dot light-emitting layer.

Discussion

As self-luminous display panels do not need a separate light source, the self-luminous display panels may be driven with a low voltage and configured in a lightweight and thin form, thereby attracting attention as next-generation display panels. Among various materials of a self-luminous display panel, a quantum dot is attracting attention as a material for such a next-generation display panel due to its excellent color reproducibility.

The above information disclosed in this section is only for understanding the background of the inventive concepts, and, therefore, may contain information that does not form prior art.

SUMMARY

One or more embodiments provide a display panel capable of improved emission quality according to a relatively simple process.

One or more embodiments provide a method of manufacturing a display panel capable of improved emission quality according to a relatively simple process.

Additional aspects will be set forth in the detailed description which follows, and, in part, will be apparent from the disclosure, or may be learned by practice of the inventive concepts.

According to an embodiment, a display panel includes light-emitting electrodes, first intermediate layers, a bank layer, a counter electrode, quantum dot light-emitting layers, and a second intermediate layer. The light-emitting electrodes are respectively disposed in first, second, and third emission areas. The first intermediate layers are respectively disposed in the first, second, and third emission areas and respectively overlap the light-emitting electrodes. The bank layer covers an edge of each of the first intermediate layers. The bank layer includes openings respectively overlapping the first intermediate layers. The counter electrode is disposed on the bank layer and covers the light-emitting electrodes. The quantum dot light-emitting layers are disposed below the counter electrode and are respectively disposed in the first, second, and third emission areas. The second intermediate layer is between the first intermediate layer in the first emission area and the quantum dot light-emitting layer in the first emission area. The second intermediate layer is disposed in an opening of the bank layer corresponding to the first emission area. The opening is one of the openings of the bank layer.

According to an embodiment, a display panel includes a cathode, a first inorganic electron layer, a bank layer, a second inorganic electron layer, a quantum dot light-emitting layer, and an anode electrode. The cathode electrode is on a substrate. The first inorganic electron layer is on the cathode electrode. The bank layer covers an edge of the first inorganic electron layer. The bank layer includes an opening overlapping the cathode electrode and the first inorganic electron layer. The second inorganic electron layer is disposed in the opening and overlaps the first inorganic electron layer. The quantum dot light-emitting layer is on the second inorganic electron layer. The anode electrode is on the quantum dot light-emitting layer.

According to an embodiment, a method of manufacturing a display panel includes forming a light-emitting electrode on a substrate; forming a first intermediate layer on the light-emitting electrode, the first intermediate layer including a metal oxide; forming a bank layer covering an edge of the first intermediate layer, the bank layer including an opening overlapping the light-emitting electrode and the first intermediate layer; forming, in the opening, a second intermediate layer overlapping the first intermediate layer; forming a quantum dot light-emitting layer on the second intermediate layer; and forming a counter electrode on the quantum dot light-emitting layer.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION OF SOME EMBODIMENTS

Figure 1:
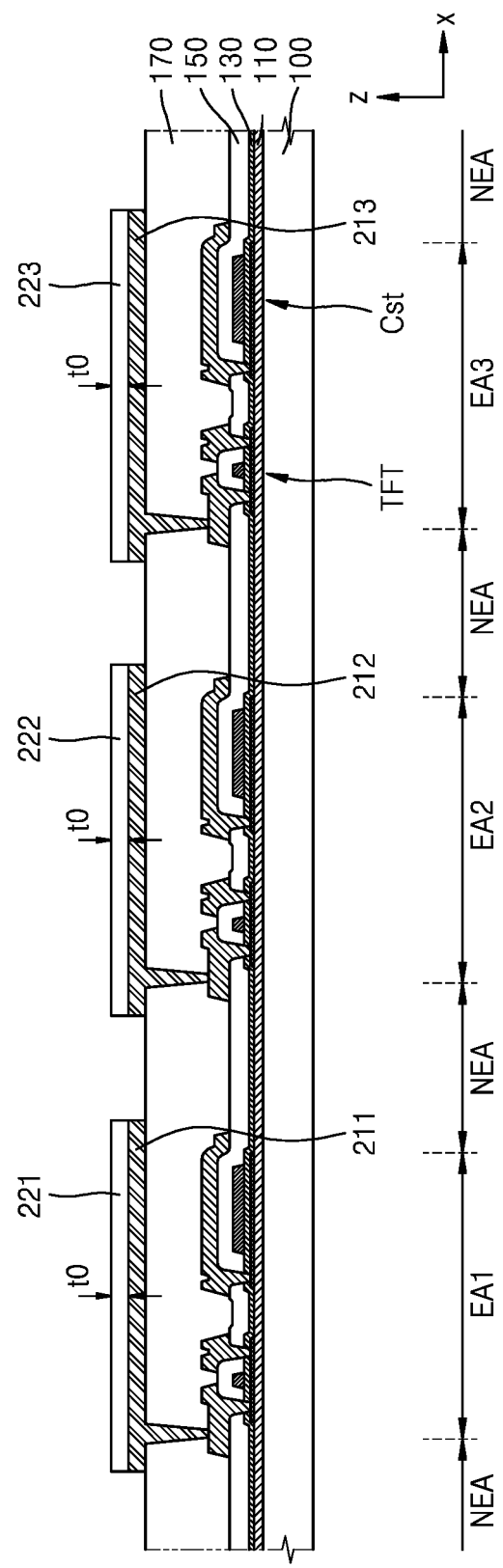
FIG. 1 is a schematic cross-sectional view showing a process of forming a first intermediate layer on a light-emitting electrode according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, various embodiments will be explained in detail with reference to the accompanying drawings.

FIG. 1 is a schematic cross-sectional view showing a process of forming a first intermediate layer on a light-emitting electrode according to an embodiment.

Referring to FIG. 1, light-emitting electrodes are formed on a substrate 100. The light-emitting electrodes may be arranged apart from one another to correspond to first, second, and third emission areas EA1, EA2, and EA3. Hereinafter, for convenience of explanation, a light-emitting electrode arranged in a first emission area EA1 is referred to as a first light-emitting electrode 211, a light-emitting electrode arranged in a second emission area EA2 is referred to as a second light-emitting electrode 212, and a light-emitting electrode arranged in a third emission area EA3 is referred to as a third light-emitting electrode 213. Furthermore, a case in which the first, second, and third emission areas EA1, EA2, and EA3 are a red emission area, a green emission area, and a blue emission area, respectively, is described as an example.

The first, second, and third light-emitting electrodes 211, 212, and 213 may be formed on the same layer. FIG. 1 illustrates that the first, second, and third light-emitting electrodes 211, 212, and 213 are formed on a planarized insulating layer 170.

Various layers may be formed before the first, second, and third light-emitting electrodes 211, 212, and 213 are formed. FIG. 1 illustrates that a thin film transistor TFT and a storage capacitor Cst are formed on the substrate 100, the planarized insulating layer 170 covering the thin film transistor TFT and the storage capacitor Cst is formed, and then the first, second, and third light-emitting electrodes 211, 212, and 213 are formed on the planarized insulating layer 170.

The substrate 100 may include various materials, for example, a glass material, a metal material, a plastic material (such as polyethylene terephthalate (PET), polyethylene naphthalate (PEN), polyimide, etc.), and/or the like. A buffer layer 110 for preventing (or at least reducing) infiltration of impurities into a semiconductor layer of the thin film transistor TFT, a gate insulating layer 130 for insulating the semiconductor layer of the thin film transistor TFT from a gate electrode, an interlayer insulating layer 150 for insulating a source electrode and a drain electrode of the thin film transistor TFT from the gate electrode, and the planarized insulating layer 170 covering the thin film transistor TFT and having an upper surface that is approximately flat may be formed on the substrate 100.

The buffer layer 110 may be formed as an oxide film, such as silicon oxide, and/or a nitride film, such as silicon nitride. The gate insulating layer 130 and the interlayer insulating layer 150 may each include silicon oxide, silicon nitride, silicon oxynitride, aluminum oxide, titanium oxide, tantalum oxide, hafnium oxide, zinc oxide, and/or the like. The planarized insulating layer 170 may include an organic material, such as acryl, benzocyclobutene (BCB), polyimide, hexamethyldisiloxane (HMDSO), and/or the like. In FIG. 1, the insulating layers from the buffer layer 110 to the planarized insulating layer 170 are described, but embodiments are not limited thereto. In some embodiments, an insulating layer may be further arranged according to the structures of the thin film transistor TFT and the storage capacitor Cst.

In some embodiments, the first, second, and third light-emitting electrodes 211, 212, and 213 may be cathode electrodes. In this case, the thin film transistor TFT electrically connected to each of the first, second, and third light-emitting electrodes 211, 212, and 213 may be an oxide TFT including an oxide semiconductor layer. The oxide TFT may have characteristics of high uniformity and fast electron mobility, and may be advantageous when used for a display panel having a large area and high resolution.

The first, second, and third light-emitting electrodes 211, 212, and 213, as reflective electrodes, may include a reflective film including at least one of silver (Ag), magnesium (Mg), aluminum (Al), platinum (Pt), palladium (Pd), gold (Au), nickel (Ni), neodymium (Nd), iridium (Ir), and chromium (Cr), or any compound thereof, and/or a conductive oxide film formed on the above-described reflective film. The conductive oxide film may include, for example, at least one of indium tin oxide (ITO), indium zinc oxide (IZO), zinc oxide (ZnO), indium oxide (In$_2$O$_3$), indium gallium oxide (IGO), aluminum zinc oxide (AZO), and the like. In an embodiment, the first, second, and third light-emitting electrodes 211, 212, and 213 may be a single layer or a multilayer. In an embodiment, the first, second, and third light-emitting electrodes 211, 212, and 213 may be a triple layer of ITO/Ag/ITO. The first, second, and third light-emitting electrodes 211, 212, and 213 may be formed by depositing at least one of the above-described materials on the planarized insulating layer 170, and then, etching the deposited material to have a certain pattern.

Next, first intermediate layers may be formed on the first, second, and third light-emitting electrodes 211, 212, and 213, respectively. FIG. 1 illustrates, in association with some embodiments, that the first intermediate layers are first inorganic electron layers 221, 222, and 223 including an inorganic material.

The first inorganic electron layers 221, 222, and 223 may be arranged in the first, second, and third emission areas EA1, EA2, and EA3, respectively, overlapping the first, second, and third light-emitting electrodes 211, 212, and 213. The first inorganic electron layers 221, 222, and 223 may be apart from one another, and may be in direct contact with the first, second, and third light-emitting electrodes 211, 212, and 213, respectively. Although FIG. 1 illustrates that the widths of the first inorganic electron layers 221, 222, and 223 are the same as the widths of the first, second, and third light-emitting electrodes 211, 212, and 213, in some embodiments, the widths of the first inorganic electron layers 221, 222, and 223 may differ from the widths of the first, second, and third light-emitting electrodes 211, 212, and 213. For example, one or more of the widths of the first inorganic electron layers 221, 222, and 223 may be greater than or less than one or more of the widths of the first, second, and third light-emitting electrodes 211, 212, and 213.

The first inorganic electron layers 221, 222, and 223 may be formed together in the same process and may include the same inorganic material. For example, the first inorganic electron layers 221, 222, and 223 that are apart from one another may be formed by forming a preliminary inorganic electron layer covering the substrate 100 through a deposition method, such as a sputtering or pulse laser deposition method (PLD), and then performing a photolithography process to pattern the preliminary inorganic electron layer.

Each of the first inorganic electron layers 221, 222, and 223 may include a metal oxide, in which metal may include alkali earth metal, transition metal, group 13 metal, and/or group 14 metal. For example, the metal in the above-described metal oxide may include at least one of Zn, Ti, Zr, Sn, W, Ta, Ni, Mo, Cu, Mg, Co, Mn, Y, and Al, or any combination thereof.

In an embodiment, the above-described metal oxide may be expressed as in Chemical Formula 1 below.

$$M_aO_b \qquad \text{Chemical Formula 1}$$

In Chemical Formula 1, M denotes Zn, Ti, Zr, Sn, W, Ta, Ni, Mo, or Cu, and a and b denote 1 or 5 independently of each other.

In an embodiment, the above-described metal oxide may be expressed as in Chemical Formula 2 below.

$Zn_{(1-c)}M'_cO$ <span>Chemical Formula 2</span>

In Chemical Formula 2, M' denotes at least one of Mg, Co, Ni, Zr, Mn, Sn, Y, and Al, or any combination thereof, and c denotes a number that is greater than 0 and less than or equal to 0.5.

The first inorganic electron layers 221, 222, and 223 may each have substantially the same thickness t0. The thickness t0 of each of the first inorganic electron layers 221, 222, and 223 may be determined based on an optical resonance distance of a quantum dot light-emitting diode that is arranged in the third emission area EA3 and emits blue light, which will be described in more detail below.

Figure 2:
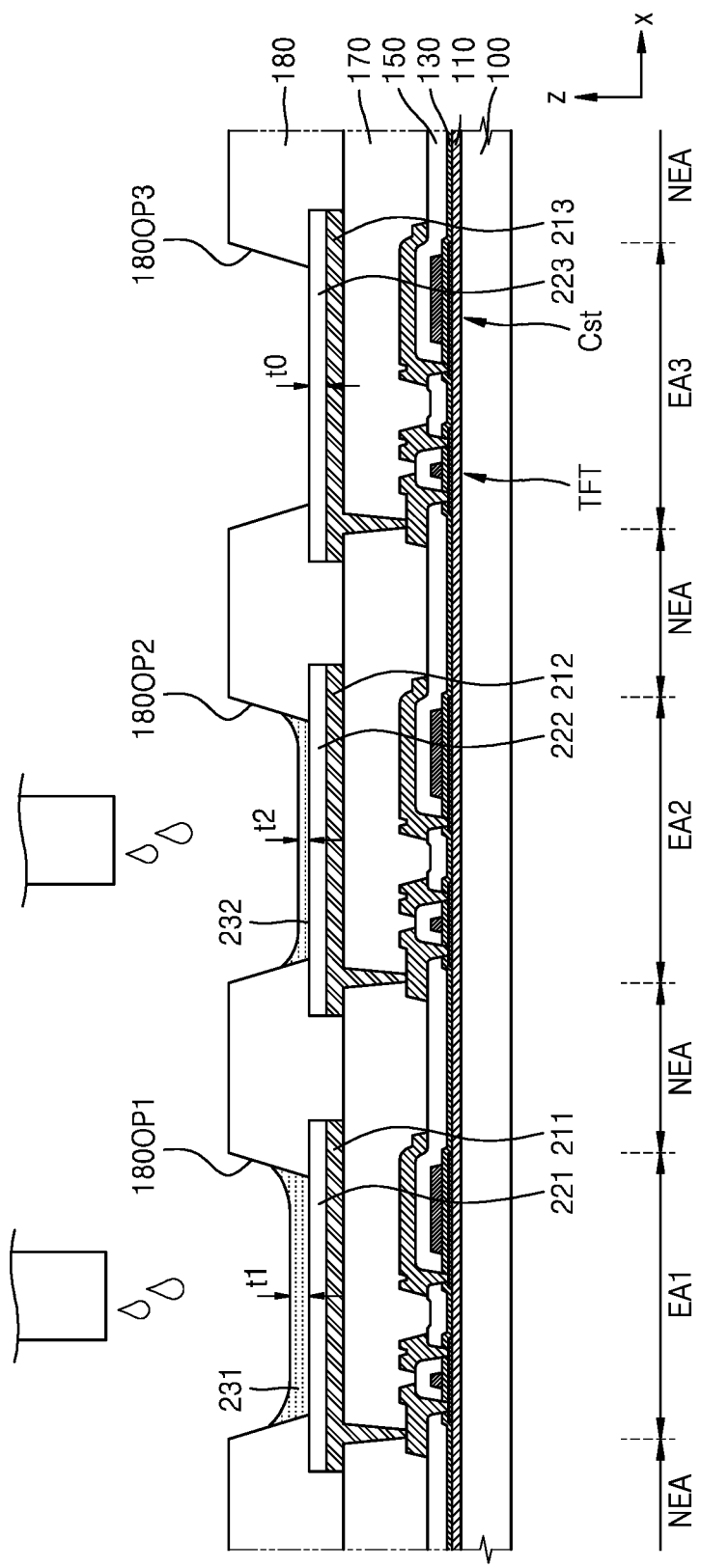
FIG. 2 is a schematic cross-sectional view showing a process of forming a second intermediate layer on a first intermediate layer according to an embodiment.

FIG. 2 is a schematic cross-sectional view showing a process of forming a second intermediate layer on a first intermediate layer according to an embodiment.

Referring to FIG. 2, a bank layer 180 is formed on the first inorganic electron layers 221, 222, and 223. The bank layer 180 may cover a non-emission area NEA and include first, second, and third openings 180OP1, 180OP2, and 180OP3 that are arranged in the first, second, and third emission areas EA1, EA2, and EA3, respectively. The first, second, and third openings 180OP1, 180OP2, and 180OP3 of the bank layer 180 may overlap the first inorganic electron layers 221, 222, and 223 and the light-emitting electrodes thereunder, for example, the first, second, and third light-emitting electrodes 211, 212, and 213.

The first, second, and third openings 180OP1, 180OP2, and 180OP3 may define areas of the first, second, and third emission areas EA1, EA2, and EA3 where light is emitted. The size (or width) of each of the first, second, and third openings 180OP1, 180OP2, and 180OP3 may correspond to the size (or width) of each of effective emission areas of the first, second, and third emission areas EA1, EA2, and EA3.

The size (or width) of each of the first, second, and third openings 180OP1, 180OP2, and 180OP3 may be less than the width of each of the first inorganic electron layers 221, 222, and 223 and the width of each of the first, second, and third light-emitting electrodes 211, 212, and 213, which are arranged thereunder. For example, the width of the first opening 180OP1 may be less than the widths of the first inorganic electron layer 221 and the first light-emitting electrode 211, which are arranged below the first opening 180OP1. The width of the second opening 180OP2 may be less than the widths of the first inorganic electron layer 222 and the second light-emitting electrode 212, which are arranged below the second opening 180OP2. The width of the third opening 180OP3 may be less than the widths of the first inorganic electron layer 223 and the third light-emitting electrode 213, which are arranged below the third opening 180OP3. Accordingly, the edges of the first inorganic electron layers 221, 222, and 223 and the edges of the first, second, and third light-emitting electrodes 211, 212, and 213 may be covered by bank layer 180.

The bank layer 180 may include a liquid repellency material to prevent a light-emitting material from being coated between neighboring emission areas in an inkjet process to form a quantum dot light-emitting layer that is described in more detail below.

In some embodiments, the bank layer 180 may have a liquid repellency character only on an upper surface of a bank material portion between neighboring openings. For example, in an embodiment, the upper surface of the bank material portion may have hydrophobicity through a plasma processing method using a gas including fluorine. In another embodiment, the bank layer 180 may include, for example, a polymer material of a molecular weight of 8000 to 20000 and having a main chain and a side chain, in which a fluorine compound is mixed in an organic material, such as polyimide. Various methods may be used including a method of allowing a liquid repellency material to be present on an upper portion of the bank layer 180, for example, an upper surface of a bank material portion between neighboring openings, by forming and baking a preliminary-bank layer including the above-described material.

Second intermediate layers are formed after the bank layer 180 is formed. The second intermediate layers may be formed in two openings selected from the first, second, and third openings 180OP1, 180OP2, and 180OP3. In this regard, FIG. 2 illustrates an example in which the second inorganic electron layers 231 and 232 including an inorganic material are formed in the first opening 180OP1 and the second opening 180OP2, respectively. The second inorganic electron layers 231 and 232 may each be formed through an inkjet method.

In the process described above with reference to FIG. 1, when the thickness t0 of each of the first inorganic electron layers 221, 222, and 223 is thick corresponding to a resonance distance of a quantum dot light-emitting diode formed in the third emission area EA3, a separate second intermediate layer may not be formed in the third opening 180OP3 arranged in the third emission area EA3, and thus, it may be advantageous to reduce the number of processes.

Each of the second inorganic electron layers 231 and 232 may include a metal oxide dispersed in solvent including an organic material, in which the metal may include alkali earth metal, transition metal, group 13 metal, and/or group 14 metal. For example, the metal in the above-described metal oxide may include at least one of Zn, Ti, Zr, Sn, W, Ta, Ni, Mo, Cu, Mg, Co, Mn, Y, and Al, or any combination thereof.

The metal oxide of each of the second inorganic electron layers 231 and 232 may include the above-described metal expressed in Chemical Formula 1 and/or Chemical Formula 2. In an embodiment, the metal oxide included in the second inorganic electron layers 231 and 232 may be the same as the metal oxide included in the first inorganic electron layers 221, 222, and 223. Alternatively, the metal oxide included in the second inorganic electron layers 231 and 232 may be different from the metal oxide included in the first inorganic electron layers 221, 222, and 223.

The first inorganic electron layers 221, 222, and 223 and/or the second inorganic electron layers 231 and 232, including the metal oxide, may be electron transport layers or electron injection layers. In an embodiment, the first inorganic electron layers 221, 222, and 223 and/or the second inorganic electron layers 231 and 232 may function as an electron transport layer.

The second inorganic electron layers 231 and 232, which are formed in a different process from the first inorganic electron layers 221, 222, and 223, may have different densities. For example, the density of each of the second inorganic electron layers 231 and 232 may be less than the density of each of the first inorganic electron layers 221, 222, and 223.

The second inorganic electron layers 231 and 232 may further include an additive for dispersion stability of metal oxides dispersed in solvent. In other words, the second inorganic electron layers 231 and 232 may not include a material that does not exist in the first inorganic electron layers 221, 222, and 223, for example, a material corresponding to an additive and/or solvent, for example, an organic material and/or the like.

In the second inorganic electron layers 231 and 232 formed by an inkjet method, the thickness may be formed non-uniformly by a coffee ring effect. In this regard, FIG. 2 illustrates that the thickness of the edge of each of the second inorganic electron layers 231 and 232 is relatively thicker than in a central region.

The second inorganic electron layer 231 formed in the first opening 180OP1 and the second inorganic electron layer 232 formed in the second opening 180OP2 may have different thicknesses. The thicknesses t1 and t2 of the second inorganic electron layers 231 and 232 may depend on a resonance distance of the light emitted from a quantum dot light-emitting diode in a corresponding emission area. For example, the thickness of the second inorganic electron layer 231 in the first opening 180OP1, for example, an average thickness t1 of the first inorganic electron layer 231, may have a value corresponding to a resonance distance of the light, for example, red light, emitted from a first quantum dot light-emitting diode to be arranged in the first emission area EA1. The thickness of the second inorganic electron layer 232 in the second opening 180OP2, for example, an average thickness t2 of the second inorganic electron layer 232, may have a value corresponding to a resonance distance of the light, for example, green light, emitted from a second quantum dot light-emitting diode to be arranged in the second emission area EA2. For example, in the first emission area EA1, the sum (t0+t1) of the thicknesses of a first inorganic electron layer 221 and a second inorganic electron layer 231 may be determined based on a resonance distance corresponding to the light, for example, red light, emitted from the first emission area EA1. Similarly, in the second emission area EA2, the sum (t0+t2) of the thicknesses of a first inorganic electron layer 222 and a second inorganic electron layer 232 may be determined based on a resonance distance corresponding to the light, for example, green light, emitted from the second emission area EA2. The thickness t1 of the second inorganic electron layer 231 in the first opening 180OP1 may be greater than the thickness t2 of the second inorganic electron layer 232 in the second opening 180OP2.

When the thickness of the intermediate layer, which is interposed between the first, second, and third light-emitting electrodes 211, 212, and 213 and the first, second, and third quantum dot light-emitting layers 241, 242, and 243 of FIG. 3 formed in a process that will be described below, is non-uniform, current non-uniformity may occur between a thin portion and a thick portion of the intermediate layer having an non-uniform thickness. As such, the quality of light emitted from a corresponding emission area may be degraded. For instance, the intensity and/or brightness of light is changed due to the thickness non-uniformity of the intermediate layer even in the same emission area. However, according to one or more embodiments, as described with reference to FIG. 1, as the second inorganic electron layers 231 and 232 are formed after the first inorganic electron layers 221, 222, and 223 having the thickness t0 that is relatively uniform are formed, unlike a comparative example in which an inorganic electron layer is formed by an inkjet method only, the thickness uniformity of the intermediate layer arranged between the first, second, and third light-emitting electrodes 211, 212, and 213 and the first, second, and third quantum dot light-emitting layers 241, 242, and 243 of FIG. 3 may be improved and the resonance distance of the light emitted from each emission area may be adjusted. Accordingly, emission quality in each emission area may be increased.

According to one or more embodiments, as the second inorganic electron layers 231 and 232 are formed after the first inorganic electron layers 221, 222, and 223 are formed, the concentration of an inkjet material to implement the second inorganic electron layers 231 and 232 may be implemented using a material having a relatively low concentration. Accordingly, a nozzle clogging problem in the inkjet printing process may be prevented or reduced.

According to one or more embodiments, as the first inorganic electron layers 221, 222, and 223 having no additive are formed in the respective emission areas, the reduction of the light-emitting efficiency and/or the lifespan of a quantum dot light-emitting diode, which may be generated when an additive is excessively included, may be prevented or reduced.

Figure 3:
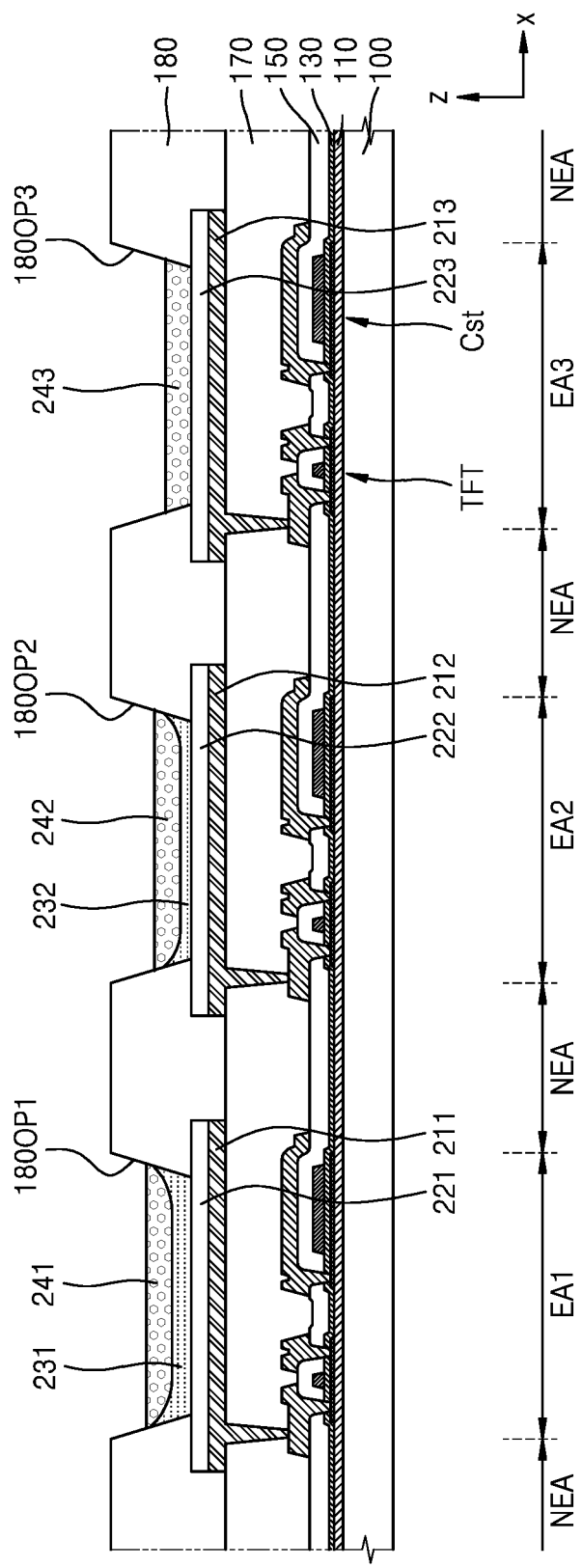
FIG. 3 is a schematic cross-sectional view showing a process of forming a quantum dot light-emitting layer according to an embodiment.

FIG. 3 is a schematic cross-sectional view showing a process of forming a quantum dot light-emitting layer according to an embodiment.

Referring to FIG. 3, first, second, and third quantum dot light-emitting layers 241, 242, and 243 are formed in the first, second, and third emission areas EA1, EA2, and EA3, respectively.

The first, second, and third quantum dot light-emitting layers 241, 242, and 243 may each include quantum dots having a core-shell structure. The core of a quantum dot may be at least one selected from the group consisting of a group II-VI compound, a group III-V compound, a group IV-VI compound, a group IV compound, a group IV compound, and any combination thereof.

The group II-VI compound may be at least one selected from the group consisting of two-element compounds selected from the group consisting of CdSe, CdTe, ZnS, ZnSe, ZnTe, ZnO, HgS, HgSe, HgTe, MgSe, MgS, and any mixture thereof; three-element compounds at least one selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and four-element compounds at least one selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The group III-V compound may be at least one selected from the group consisting of two-element compounds selected from the group consisting of GaN, GaP, GaAs, GaSb, AlN, AlP, AlAs, AlSb, InN, InP, InAs, InSb, and any mixture thereof; three-element compounds at least one selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any mixture thereof; and four-element compounds at least one selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof.

The group IV-VI compound may be at least one selected from the group consisting of two-element compounds at least one selected from the group consisting of SnS, SnSe, SnTe, PbS, PbSe, PbTe, and any mixture thereof; three-element compounds at least one selected from the group consisting of SnSeS, SnSeTe, SnSTe, PbSeS, PbSeTe, PbSTe, SnPbS, SnPbSe, SnPbTe, and any mixture thereof; and four-element compounds at least one selected from the group consisting of SnPbSSe, SnPbSeTe, SnPbSTe, and any mixture thereof. The group IV element may be at least one selected from the group consisting of Si, Ge, and any mixture thereof. The group IV compound may include two-element compounds at least one selected from the group consisting of SiC, SiGe, and any mixture thereof.

In this state, the two-element compound, the three-element compound, or the four-element compound may exist in a particle at a uniform concentration, or exist in the same particles by being divided into partially different concentration distribution states. As another example, the first, second, and third quantum dot light-emitting layers 241, 242, and 243 may have a core/shell structure. An interface between a core and a shell may have a concentration gradient in which the concentration of an element existing in the shell gradually decreases toward the center.

In some embodiments, a quantum dot may have a core-shell structure including a core including nano crystal(s) and a shell surrounding the core. The shell of the quantum dot may function as a protection layer to maintain a semiconductor characteristic by preventing the chemical denaturation of the core and/or a charging layer to give an electrophoretic characteristic to the quantum dot. The shell may be a single layer or a multilayer. The interface between the core and the shell may have a concentration gradient in which the concentration of an element existing in the shell gradually decrease toward the center. Examples of the shell of the quantum dot may include at least one of a metal or non-metal oxide, a semiconductor compound, a combination thereof, and/or the like.

For example, the metal or non-metal oxide may include two-element compounds such as at least one of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or three-element compounds such as at least one of $MgAl_2O_4$, $CoFe_2O_4$, $NiFe_2O_4$, $CoMn_2O_4$, and the like, but embodiments are not limited thereto.

Also, the semiconductor compound may include at least one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but embodiments are not limited thereto.

The quantum dot may have a full width at half maximum (FWHM) of a light-emitting wavelength spectrum of about 45 nm or less, e.g., about 40 nm or less, such as about 30 nm or less, and color purity and color reproducibility may be improved within the above range. Furthermore, the light emitted through the quantum dot is emitted in all directions, thereby improving a light viewing angle.

Furthermore, although the shape of a quantum dot is not particularly limited, any shape that is generally used in the field may be utilized in association with embodiments, for example, shapes of a sphere, a pyramid, a multi-arm, cubic nano particles, nano tubes, nanowires, nano fibers, nano plate particles, and/or the like.

The quantum dot may control the color of emitted light according to the size of a particle, and accordingly the quantum dot may have various light emission colors, such as blue, red, green, and/or the like. The first, second, and third quantum dot light-emitting layers 241, 242, and 243 may emit light of different wavelengths according to the size of an included quantum dot. For example, the first quantum dot light-emitting layer 241 may emit red light, the second quantum dot light-emitting layer 242 may emit green light, and the third quantum dot light-emitting layer 243 may emit blue light. In some embodiments, the first, second, and third quantum dot light-emitting layers 241, 242, and 243 may be formed by dispersing quantum dots in solvent, applying the solvent with quantum dots to the first, second, and third openings 180OP1, 180OP2, and 180OP3 by an inkjet method and/or the like, and then volatizing the above-described solvent.

Figure 4A:
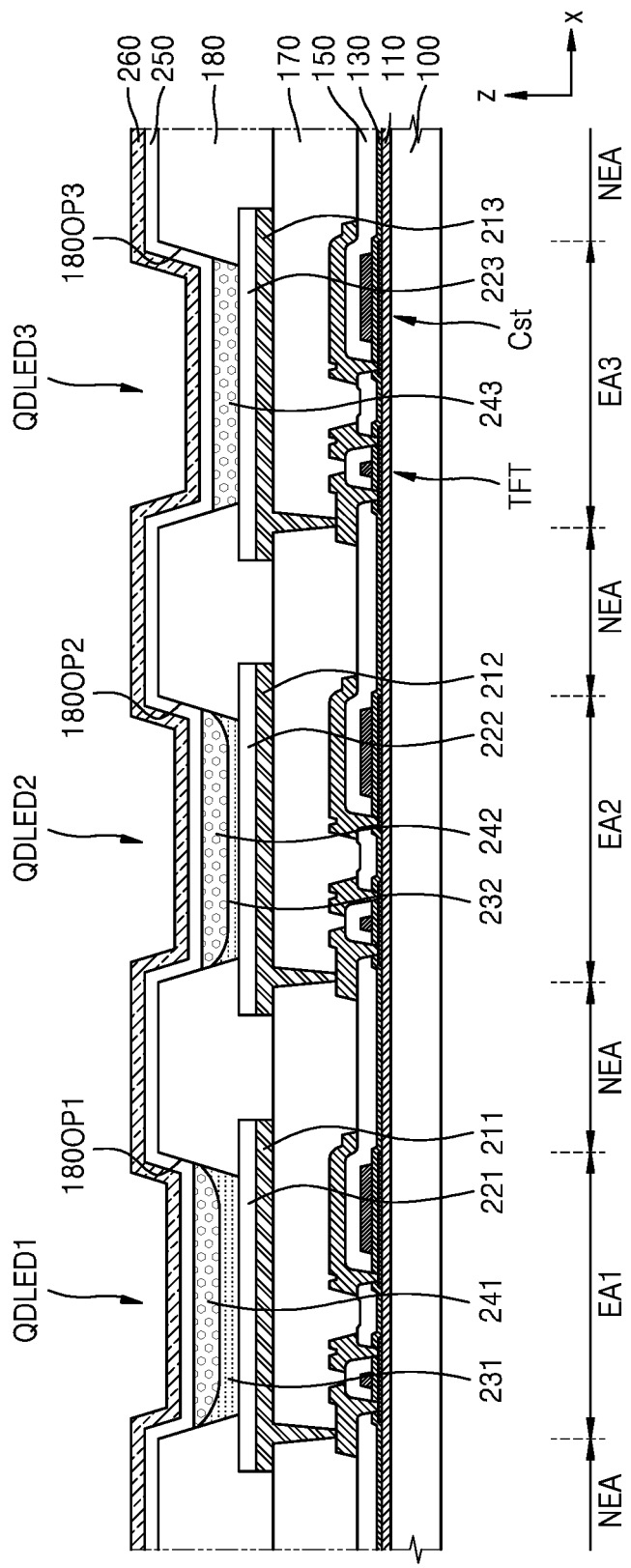
FIGS. 4A and 4B are schematic cross-sectional views showing processes of forming a third intermediate layer and a counter electrode, respectively, according to some embodiments.
Figure 4B:
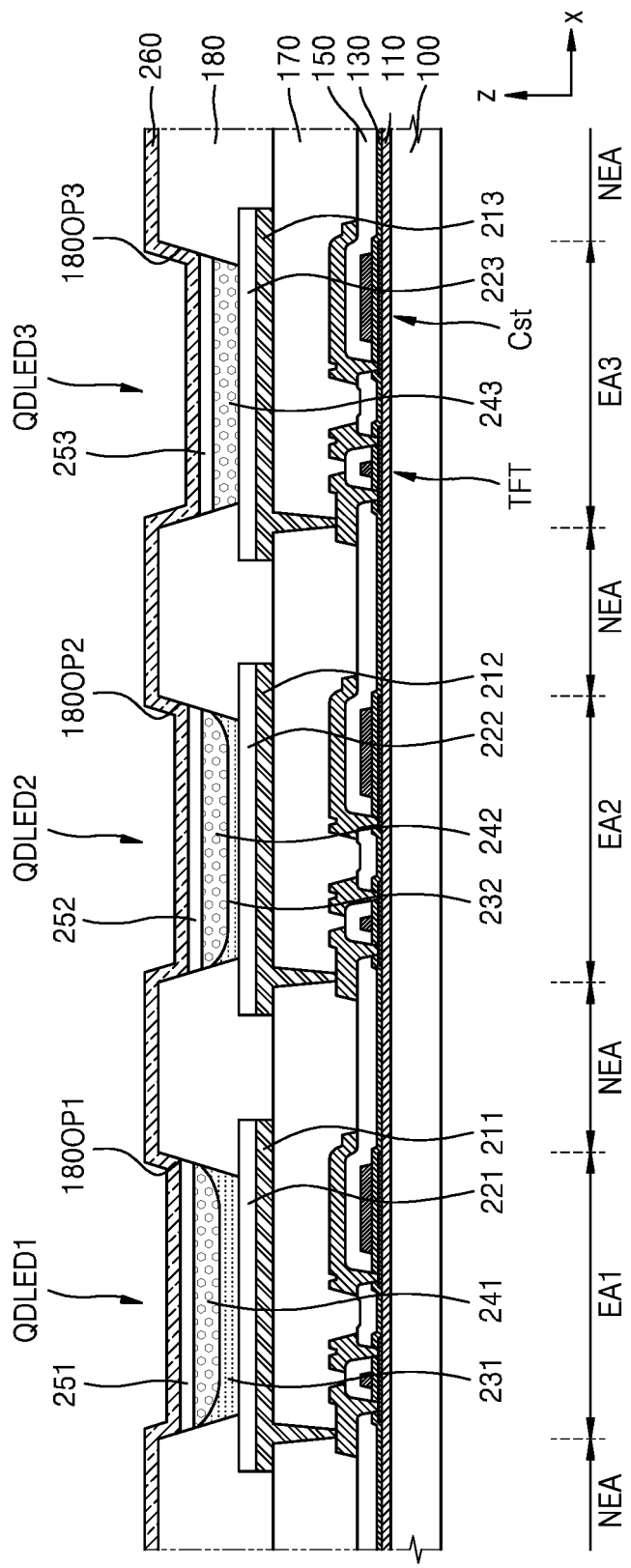

FIGS. 4A and 4B are schematic cross-sectional views showing processes of forming a third intermediate layer and a counter electrode, respectively, according to some embodiments.

Next, referring to FIG. 4A, a third intermediate layer is formed on the first, second, and third quantum dot light-emitting layers 241, 242, and 243. FIG. 4A illustrates, in association with an embodiment, that the third intermediate layer is a hole layer 250 that is integrally formed to cover (e.g., entirely cover) the first, second, and third emission areas EA1, EA2, and EA3 and the non-emission area NEA. The hole layer 250 may cover an upper surface of a portion of the bank layer 180 arranged in the non-emission area NEA. The hole layer 250 may include a hole transport layer and/or a hole injection layer. The hole layer 250 may be formed in a deposition method.

The hole layer 250 may include an organic material or an inorganic material. In some embodiments, the hole layer 250 may include at least one of 4,4'-bis-(carbazole-9-yl)biphenyl (CBP), 4,4-bis[N-(1-naphthyl)-N-phenyl-amino]biphenyl (α-NPD), Tris(4-carbazoyl-9-ylphenyl)amine (TCTA), and 4,4'-Bis[N-[4-{N,N-bis(3-methylphenyl)amino}phenyl]-N-phenylamino]biphenyl (DNTPD). In some embodiments, the hole layer 250 may include at least one of NiO and $MoO_3$.

FIG. 4A illustrates an example in which the third intermediate layer is the hole layer 250 integrally formed to cover (e.g., entirely cover) the substrate 100, but embodiments are not limited thereto. In some embodiments, such as illustrated in FIG. 4B, the third intermediate layer includes hole layers 251, 252, and 253 that are apart from one another and arranged in the respective emission areas. For instance, the hole layers 251, 252, and 253 may be arranged in is the first, second, and third emission areas EA1, EA2, and EA3, respectively. The hole layers 251, 252, and 253 may be formed by an inkjet method in the first, second, and third openings 180OP1, 180OP2, and 180OP3 of the bank layer 180, respectively. The hole layers 251, 252, and 253 that are apart from one another may not be arranged on an upper surface of the bank layer 180, for example, an upper surface of a portion of the bank layer 180 arranged in the non-emission area NEA.

Next, a counter electrode 260 is formed on the third intermediate layer illustrated in FIGS. 4A and 4B. The counter electrode 260 may be integrally formed to cover (e.g., entirely cover) the first, second, and third emission areas EA1, EA2, and EA3, and/or the substrate 100.

In some embodiments, the counter electrode 260 may be an anode electrode. The counter electrode 260 may include a light-transmissive electrode and/or a semi-transmissive electrode. In some embodiments, the counter electrode 260 may include a semi-transmissive thin film including at least one of Li, Ca, LiF/Ca, LiF/Al, Al, Mg, and any compound thereof, and/or a light transmissive film including at least one of ITO, IZO, ITZO, and AZO.

A stack structure from the first light-emitting electrode 211 to the counter electrode 260 in the first emission area EA1 may form the first quantum dot light-emitting diode QDLED1. A stack structure from the second light-emitting electrode 212 to the counter electrode 260 in the second emission area EA2 may form the second quantum dot light-emitting diode QDLED2. A stack structure from the third light-emitting electrode 213 to the counter electrode 260 in the third emission area EA3 may form a third quantum dot light-emitting diode QDLED3.

A distance (e.g., a vertical distance in a z-axis direction) from the first light-emitting electrode 211 to the counter electrode 260 in the first emission area EA1 may be an optical resonance distance of light, for example, red light, emitted from the first quantum dot light-emitting diode QDLED1. A distance (e.g., a vertical distance in a z-axis direction) from the second light-emitting electrode 212 to the counter electrode 260 in the second emission area EA2 may be an optical resonance distance of light, for example, green light, emitted from the second quantum dot light-emitting diode QDLED2. A distance (e.g., a vertical distance in a z-axis direction) from the third light-emitting electrode 213 to the counter electrode 260 in the third emission area EA3 may be an optical resonance distance of light, for example, blue light, emitted from the third quantum dot light-emitting diode QDLED3.

Figure 5:
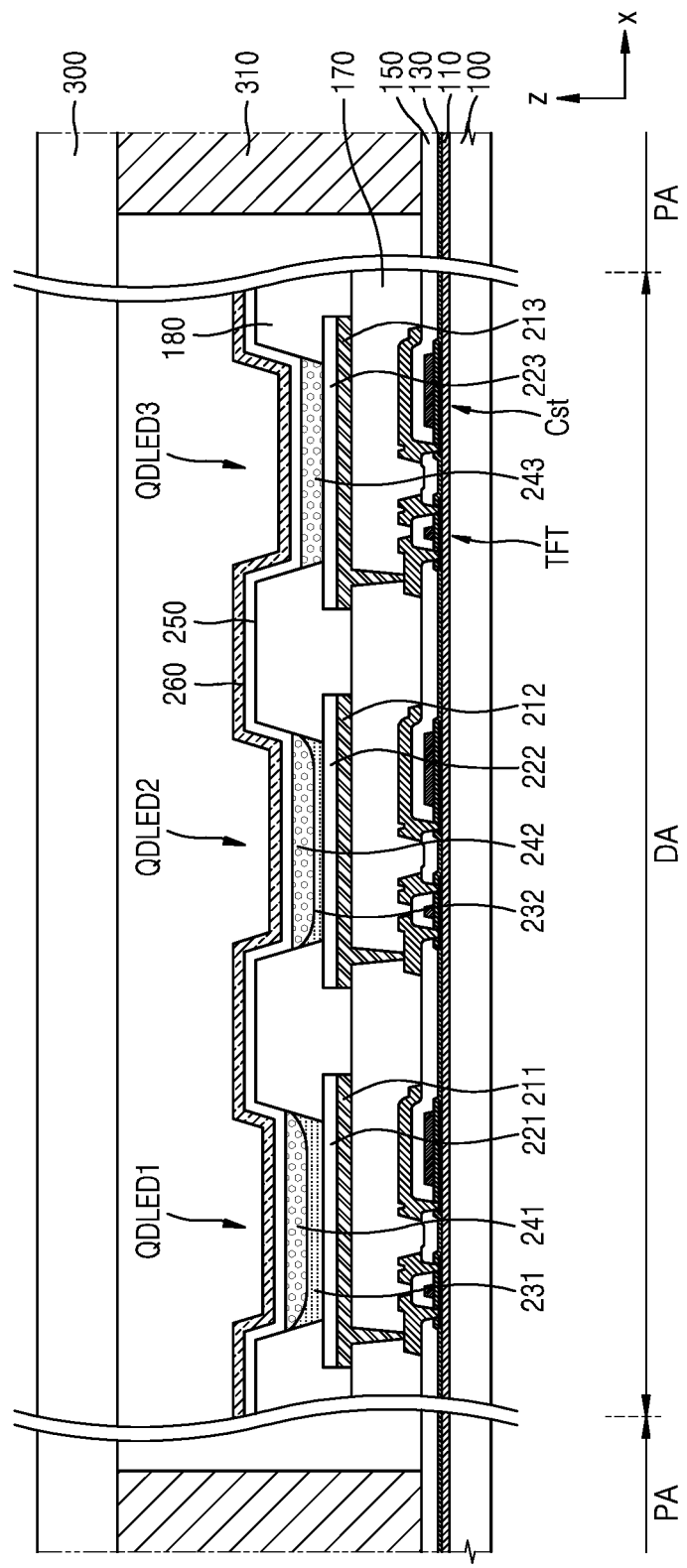
FIG. 5 is a schematic cross-sectional view showing a process of forming an encapsulation substrate and a sealant according to an embodiment.

FIG. 5 is a schematic cross-sectional view showing a process of forming an encapsulation substrate and a sealant according to an embodiment.

Referring to FIG. 5, an encapsulation substrate 300 may be arranged to face the substrate 100, and a sealant 310 including, for instance, frit and/or the like, may be arranged between the substrate 100 and the encapsulation substrate 300, thereby hermetically sealing the first, second, and third quantum dot light-emitting diodes QDLED1, QDLED2, and QDLED3 between the substrate 100 and the encapsulation substrate 300.

The encapsulation substrate 300 may be arranged to face the substrate 100 such that the first, second, and third quantum dot light-emitting diodes QDLED1, QDLED2, and QDLED3 are provided between the substrate 100 and the encapsulation substrate 300.

A display panel may include a peripheral area PA that surrounds a display area DA including the first, second, and third emission areas EA1, EA2, and EA3 and the non-emission area NEA, when viewed in a direction perpendicular to the substrate 100. The sealant 310 may be arranged in the peripheral area PA. For instance, the sealant 310 may surround (e.g., entirely surround) the display area DA in the peripheral area PA, and may protect the first, second, and third quantum dot light-emitting diodes QDLED1, QDLED2, and QDLED3 from external foreign materials, for example, moisture, air, and/or the like.

The encapsulation substrate 300 may include various materials, for example, a glass material, a metal material, a plastic material (such as PET, PEN, polyimide, etc.), and/or the like. In some embodiments, the encapsulation substrate 300 may include ultra-thin glass (UTG) having a thickness of 0.01 mm or less.

Although FIG. 5 illustrates that the encapsulation substrate 300 is arranged on the first, second, and third quantum dot light-emitting diodes QDLED1, QDLED2, and QDLED3 of FIG. 4A, the encapsulation substrate 300 may be arranged on the first, second, and third quantum dot light-emitting diodes QDLED1, QDLED2, and QDLED3 of FIG. 4B, and the first, second, and third quantum dot light-emitting diodes QDLED1, QDLED2, and QDLED3 of FIG. 4B may be hermetically sealed using the sealant 310. The first, second, and third quantum dot light-emitting diodes QDLED1, QDLED2, and QDLED3 of FIGS. 6A and 6B, which are described below, may be hermetically sealed using the encapsulation substrate 300 and the sealant 310.

FIG. 5 illustrates an example in which the encapsulation substrate 300 and the sealant 310 are used to hermetically seal the first, second, and third quantum dot light-emitting diodes QDLED1, QDLED2, and QDLED3, but embodiments are not limited thereto. In some embodiments, an encapsulation layer including at least one inorganic encapsulation layer and at least one organic encapsulation layer may be formed on the first, second, and third quantum dot light-emitting diodes QDLED1, QDLED2, and QDLED3. For example, the encapsulation layer may have a structure in which an inorganic encapsulation layer and an organic encapsulation layer are alternately stacked, for example, a stack structure of an inorganic encapsulation layer/an organic encapsulation layer/an inorganic encapsulation layer may be used. The inorganic encapsulation layer may be deposited by a chemical vapor deposition method and the organic encapsulation layer may be formed by applying a monomer and curing the monomer to form a polymer, or by applying a polymer, but embodiments are not limited thereto.

According to at least some of the embodiments described with reference to FIGS. 1 to 3, 4A, 4B, and 5, the first, second, and third light-emitting electrodes 211, 212, and 213 are cathode electrodes and the counter electrode 260 is an anode electrode, but embodiments are not limited thereto. In some embodiments, such as illustrated in FIGS. 6A and 6B, the first, second, and third light-emitting electrodes 1211, 1212, and 1213 may be anode electrodes and a counter electrode 1260 may be a cathode electrode.

Figure 6A:
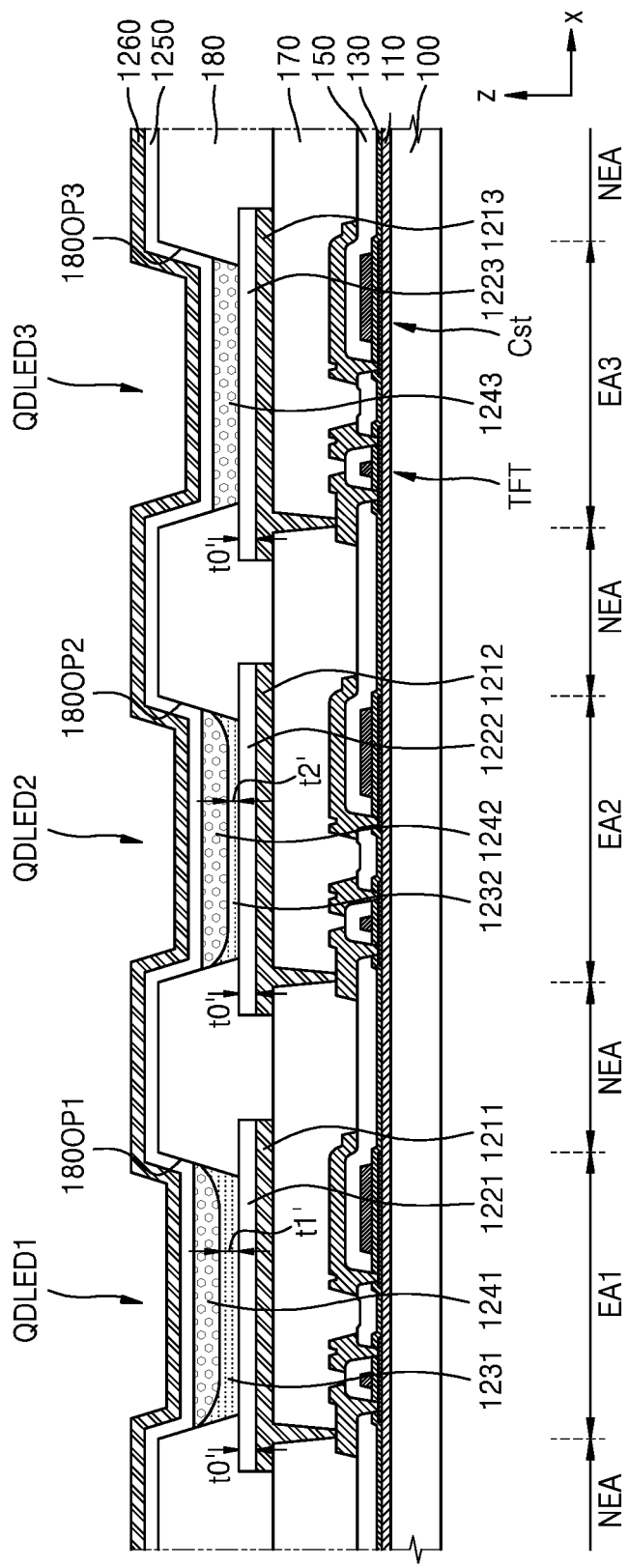
FIGS. 6A and 6B are schematic cross-sectional views of display panels according to some embodiments.
Figure 6B:
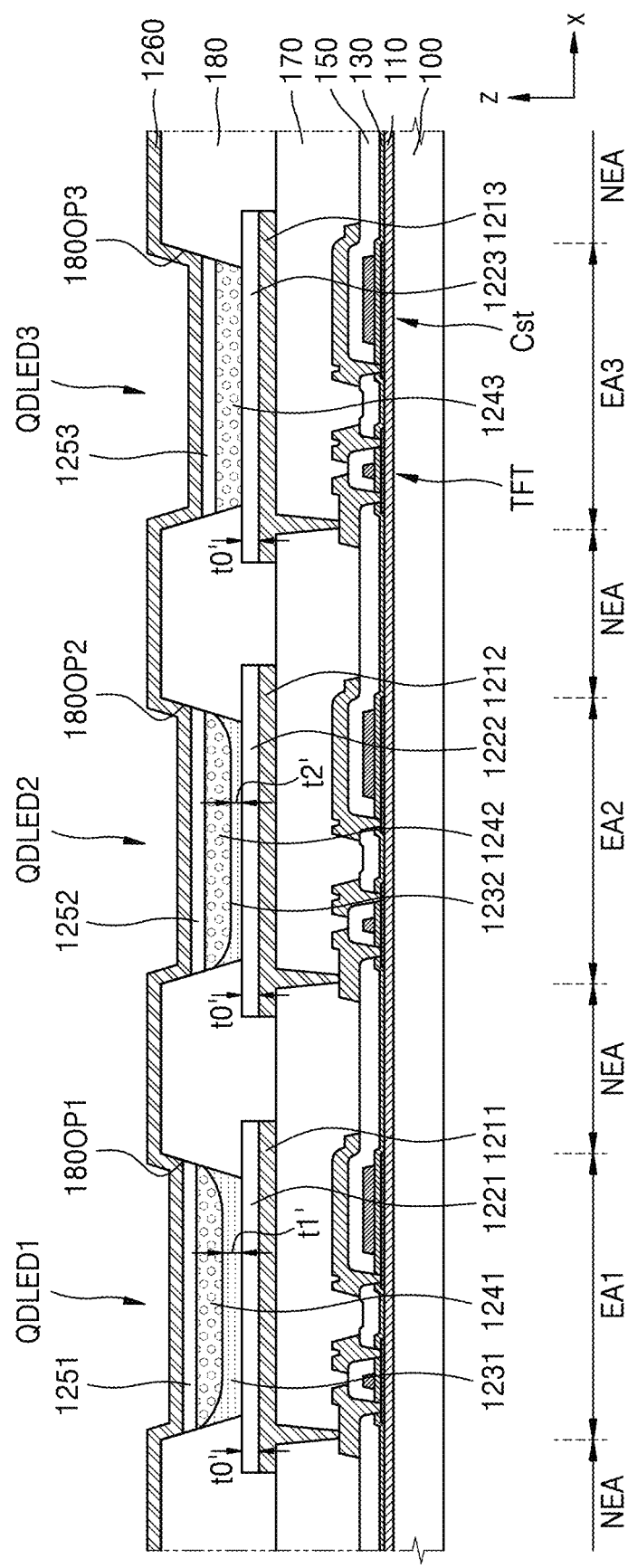

FIGS. 6A and 6B are schematic cross-sectional views of a display panel according to some embodiments.

Referring to FIGS. 6A and 6B, the first, second, and third light-emitting electrodes 1211, 1212, and 1213 may be formed on the substrate 100, and each of the first, second, and third light-emitting electrodes 1211, 1212, and 1213 may be an anode electrode. The thin film transistors TFT that are respectively and electrically connected to the first, second, and third light-emitting electrodes 1211, 1212, and 1213 may be silicon-based TFTs including polysilicon or amorphous silicon, and each of the thin film transistors TFT may be electrically connected to each storage capacitor Cst.

The first, second, and third light-emitting electrodes 1211, 1212, and 1213, which are reflective electrodes, may include a reflective film including at least one of Ag, Mg, Al, Pt, Pd, Au, Ni, Nd, Ir, and Cr, or a compound thereof, and/or a conductive oxide film formed on the above-described reflective film. In an embodiment, the first, second, and third light-emitting electrodes 1211, 1212, and 1213 may include a multilayer structure of ITO/Ag/ITO.

A first intermediate layer may be arranged on the first, second, and third light-emitting electrodes 1211, 1212, and 1213 that are apart from one another. In this regard, FIGS. 6A and 6B illustrate an example in which the first intermediate layer includes the first inorganic hole layers 1221, 1222, and 1223 including an inorganic material.

The first inorganic hole layers 1221, 1222, and 1223 may each include a metal oxide. In some embodiments, the metal of a metal oxide corresponding to the first inorganic hole layers 1221, 1222, and 1223 may include at least one of molybdenum (Mo), tungsten (W), vanadium (V), niobium (Nb), and tantalum (Ta), or any combination thereof. In an embodiment, the metal oxide of each of the first inorganic hole layers 1221, 1222, and 1223 may be tungsten oxide. In an embodiment, the metal oxide of each of the first inorganic hole layers 1221, 1222, and 1223 may be an oxide including an element A and an element B. The element A may be any one of Mo and W, and the element B may be any one of V, Nb, and Ta. In some embodiments, the content (x) of an element may be greater than 0 and less than or equal to 15 atomic percent (at %) ($0 < x \leq 15$ at %).

The first inorganic hole layers 1221, 1222, and 1223 may be formed by a deposition process, such as sputtering, chemical vapor deposition, and/or the like. As the first inorganic hole layers 1221, 1222, and 1223 are formed in the same process, the first inorganic hole layers 1221, 1222, and 1223 may include the same material and have substantially the same thickness. In an embodiment, a thickness t0' of each of the first inorganic hole layers 1221, 1222, and 1223 may correspond to an optical resonance distance of a quantum dot light-emitting diode that is formed in the third emission area EA3 and emits blue light.

The first inorganic hole layers 1221, 1222, and 1223 may be arranged below the bank layer 180, and the edge of each of the first inorganic hole layers 1221, 1222, and 1223 may be covered by the bank layer 180.

The bank layer 180 may include the first, second, and third openings 180OP1, 180OP2, and 180OP3 that respectively correspond to overlap portions of the first inorganic hole layers 1221, 1222, and 1223 and the first, second, and third light-emitting electrodes 1211, 1212, and 1213. The material and detailed structure of the bank layer 180 are as described above with reference to FIG. 2.

A second intermediate layer may be formed in at least any one of the first, second, and third openings 180OP1, 180OP2, and 180OP3 of the bank layer 180. In this regard, FIGS. 6A and 6B illustrate an example in which the second inorganic hole layers 1231 and 1232 are respectively arranged in the first and second openings 180OP1 and 180OP2.

Each of the second inorganic hole layers 1231 and 1232 may include a metal oxide, as described above, and the metal of the metal oxide may include at least one of Mo, W, V, Nb, and Ta, or any combination thereof. The metal oxide included in the second inorganic hole layers 1231 and 1232 may be the same as or different from that included in the first inorganic hole layers 1221, 1222, and 1223.

The first inorganic hole layers 1221, 1222, and 1223 and/or the second inorganic hole layers 1231 and 1232 including the metal oxide may be hole transport or hole injection layers. In an embodiment, the first inorganic hole layers 1221, 1222, and 1223 and/or the second inorganic hole layers 1231 and 1232 may be hole transport layers.

Each of the second inorganic hole layers 1231 and 1232 may be formed by an inkjet printing process, and may have a different density from each of the first inorganic hole layers 1221, 1222, and 1223. For example, the density of each of the second inorganic hole layers 1231 and 1232 may be less than that of each of the first inorganic hole layers 1221, 1222, and 1223. The second inorganic hole layers 1231 and 1232 may further include an additive for the dispersion stability of metal oxides dispersed in solvent, but the first inorganic hole layers 1221, 1222, and 1223 may include no material, for example, an organic material and the like, corresponding to the additive and/or the solvent.

The thicknesses of the second inorganic hole layer 1231 in the first emission area EA1 and the second inorganic hole layer 1232 in the second emission area EA2 may be different from each other. The thicknesses t1' and t2' of the second inorganic hole layers 1231 and 1232 may be based on a resonance distance of the light emitted from a quantum dot light-emitting diode formed in an emission area.

In the first emission area EA1, a sum (t0'+t1') of the thicknesses of the first inorganic hole layer 1221 and the second inorganic hole layer 1231 may be dependent on a resonance distance corresponding to light, for example, red light, emitted from the first quantum dot light-emitting diode QDLED1.

In the second emission area EA2, a sum (t0'+t2') of the thicknesses of the first inorganic hole layer 1222 and the second inorganic hole layer 1232 may be dependent on a resonance distance corresponding to light, for example, green light, emitted from the second quantum dot light-emitting diode QDLED2.

In the third emission area EA3, the thickness t0' of the second inorganic hole layer 1233 may be dependent on a resonance distance corresponding to light, for example, blue light, emitted from the third quantum dot light-emitting diode QDLED3.

First, second, and third quantum dot light-emitting layers 1241, 1242, and 1243 may be arranged in the first, second, and third openings 180OP1, 180OP2, and 180OP3 of the bank layer 180 respectively corresponding to the first, second, and third emission areas EA1, EA2, and EA3, and the first, second, and third quantum dot light-emitting layers 1241, 1242, and 1243 may be formed by an inkjet printing process.

Each of the first, second, and third quantum dot light-emitting layers 1241, 1242, and 1243 may include quantum dots having a core-shell structure, and the core of a quantum dot may be at least one selected from a group II-VI compound, a group III-V compound, a group IV-VI compound, a group IV compound, a group IV compound, and/or any combination thereof. The detailed characteristics of the quantum dot is as described above with reference to FIG. 3.

A third intermediate layer may be arranged on the first, second, and third quantum dot light-emitting layers 1241, 1242, and 1243. The third intermediate layer, which is an inorganic electron layer including an inorganic material, may include an inorganic electron layer 1250 that is integrally formed to cover (e.g., entirely cover) the first, second, and third emission areas EA1, EA2, and EA3, such as illustrated in FIG. 6A, or may include inorganic electron layers 1251, 1252, and 1253 that are respectively arranged in the first, second, and third emission areas EA1, EA2, and EA3, such as illustrated in FIG. 6B. The inorganic electron layer 1250 of FIG. 6A and the inorganic electron layers 1251, 1252, and 1253 of FIG. 6B may be formed by a deposition or inkjet printing process.

The metal oxide corresponding to the inorganic electron layer 1250 of FIG. 6A and the inorganic electron layers 1251, 1252, and 1253 of FIG. 6B may be an oxide including alkali earth metal, transition metal, group 13 metal, and/or group 14 metal. For example, the metal in the above-described metal oxide may include at least one of Zn, Ti, Zr, Sn, W, Ta, Ni, Mo, Cu, Mg, Co, Mn, Y, and Al, or any combination thereof, such as described above with reference to FIGS. 1 and 2.

The counter electrode 1260 may be arranged on the third intermediate layer and may be formed by a deposition process. The counter electrode 1260 may be integrally formed to cover (e.g., entirely cover) the first, second, and third emission areas EA1, EA2, and EA3, and/or the substrate 100.

In some embodiments, the counter electrode 1260 may be a cathode electrode. The counter electrode 1260 may include a light-transmissive electrode and/or a semi-transmissive electrode. In some embodiments, the counter electrode 1260 may include a semi-transmissive thin film including at least one of Li, Ca, LiF/Ca, LiF/Al, Al, and Mg, or any compound thereof, and/or a light transmissive film including at least one of ITO, IZO, ITZO, and AZO.

A stack structure from the first light-emitting electrode 1211 to the counter electrode 1260 in the first emission area EA1 may form the first quantum dot light-emitting diode QDLED1. A stack structure from the second light-emitting electrode 1212 to the counter electrode 1260 in the second emission area EA2 may form the second quantum dot light-emitting diode QDLED2. A stack structure from the third light-emitting electrode 1213 to the counter electrode 1260 in the third emission area EA3 may form the third quantum dot light-emitting diode QDLED3.

A distance (e.g., a vertical distance in the z-axis direction) from the first light-emitting electrode 1211 to the counter electrode 1260 in the first emission area EA1 may be the optical resonance distance of the light, for example, red light, emitted from the first quantum dot light-emitting diode QDLED1. A distance (e.g., a vertical distance in the z-axis direction) from the second light-emitting electrode 1212 to the counter electrode 1260 in the second emission area EA2 may be the optical resonance distance of the light, for example, green light, emitted from the second quantum dot light-emitting diode QDLED2. A distance (e.g., a vertical distance in the z-axis direction) from the third light-emitting electrode 1213 to the counter electrode 1260 in the third emission area EA3 may be the optical resonance distance of the light, for example, blue light, emitted from the third quantum dot light-emitting diode QDLED3.

The second inorganic hole layers 1231 and 1232 may be formed in an inkjet method and may not have uniform thicknesses due to the above-noted coffee ring effect. In one or more embodiments, as the first inorganic hole layers 1221, 1222, and 1223 having a relatively uniform thickness are first formed before the second inorganic hole layers 1231 and 1232 are formed, the thickness uniformity of the hole layers corresponding to the first and second quantum dot light-emitting diodes QDLED1 and QDLED2 may be improved.

As the thickness t0' of the first inorganic hole layers 1221, 1222, and 1223 is formed based on the resonance distance of the light emitted from the third quantum dot light-emitting diode QDLED3, and the second inorganic hole layers 1231 and 1232 are formed by the inkjet method to have different thicknesses t1' and t2', the hole layer satisfying a resonance distance for the first, second, and third quantum dot light-emitting diodes QDLED1, QDLED2, and QDLED3 may be formed by a minimal process.

The display panel according to various embodiments may be used for an electronic device for displaying content, e.g., a video, a still image, etc. In an embodiment, the electron device may include not only portable electronic devices, such as mobile phones, smart phones, tablet personal computers (PCs), mobile communication terminals, electronic notebooks, electronic books, portable multimedia players (PMPs), navigation devices, ultra-mobile PCs (UMPCs), and the like, but also various electronic products, such as televisions, notebooks, monitors, billboards, cinema screens, Internet of things (IOT) devices, etc. Furthermore, an electronic device according to some embodiments may be used for wearable devices, such as smart watches, watch phones, glasses type displays, and head mounted displays (HMDs). Also, an electronic device according to some embodiments may include an instrument panel of a vehicle, a center information display (CID) placed on a center fascia or dashboard of a vehicle, a room mirror display that replaces a side mirror of a vehicle, and an electronic device placed on the back side of the front seat as an entertainment device for the rear seat of a vehicle.

According to one or more embodiments, as an intermediate layer existing between a light-emitting electrode and a quantum dot light-emitting layer is formed by two different processes, not only may the thickness uniformity of the layer be improved, but display quality may also be improved. Such an effect is exemplary, but the scope of the disclosure is not limited thereto.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display panel comprising:
a substrate;
light-emitting electrodes on and above the substrate, the light-emitting electrodes respectively disposed in first, second, and third emission areas;
first intermediate layers on and above the light-emitting electrodes, the first intermediate layers respectively disposed in the first, second, and third emission areas and respectively overlapping the light-emitting electrodes;
a bank layer on and above the first intermediate layers, the bank layer covering an edge of each of the first intermediate layers, the bank layer comprising openings respectively overlapping the first intermediate layers;
a counter electrode disposed on and above the bank layer and covering the light-emitting electrodes;
quantum dot light-emitting layers disposed below the counter electrode and respectively disposed in the first, second, and third emission areas; and
a second intermediate layer between the first intermediate layer in the first emission area and the quantum dot light-emitting layer in the first emission area, wherein
the second intermediate layer is disposed in an opening of the bank layer corresponding to the first emission area, the opening being one of the openings of the bank layer,
wherein a density of the first intermediate layer disposed in the first emission area and a density of the second intermediate layer disposed in the first emission area are different from each other.

2. The display panel of claim 1, wherein:
the quantum dot light-emitting layer disposed in the first emission area comprises a quantum dot light-emitting material configured to emit red or green light; and
a thickness of the first intermediate layer disposed in the first emission area is sized according to a resonance distance of blue light.

3. The display panel of claim 1, wherein:
each of the light-emitting electrodes comprises a cathode electrode;
the counter electrode comprises an anode electrode; and
each of the first intermediate layers and the second intermediate layer comprises an electron transport layer or an electron injection layer.

4. The display panel of claim 1, wherein:
each of the first intermediate layers comprises a metal oxide; and
the metal of the metal oxide comprises at least one of Zn, Ti, Zr, Sn, W, Ta, Ni, Mo, Cu, Mg, Co, Mn, Y, and Al.

5. The display panel of claim 4,
wherein the metal oxide is expressed by Chemical Formula 1 below:

$$M_aO_b \qquad \text{Chemical Formula 1}$$

wherein M denotes Zn, Ti, Zr, Sn, W, Ta, Ni, Mo, or Cu, and
a and b independently denote an integer of 1 or 5.

6. The display panel of claim 4, wherein:
wherein the metal oxide is expressed by Chemical Formula 2 below:

$Zn_{(1-c)}M'_cO$     Chemical Formula 2 wherein M' denotes at least one of Mg, Co, Ni, Zr, Mn, Sn, Y, and Al, and c denotes a number greater than 0 and less than or equal to 0.5.

7. A display panel comprising:
a substrate;
a cathode electrode on and above the substrate;
a first inorganic electron layer on and above the cathode electrode;
a bank layer on and above the first inorganic electron layer, the bank layer covering an edge of the first inorganic electron layer, the bank layer comprising an opening overlapping the cathode electrode and the first inorganic electron layer;
a second inorganic electron layer disposed in the opening and overlapping the first inorganic electron layer;
a quantum dot light-emitting layer on the second inorganic electron layer; and
an anode electrode on the quantum dot light-emitting layer,
wherein the first inorganic electron layer comprises a metal oxide, and the metal oxide is expressed by Chemical Formula 2 below:

$Zn_{(1-c)}M'_cO$     Chemical Formula 2 wherein M' denotes at least one of Mg, Co, Ni, Zr, Mn, Sn, Y, and Al, and c denotes a number greater than 0 and less than or equal to 0.5.

8. The display panel of claim 7, wherein a density of the first inorganic electron layer and a density of the second inorganic electron layer are different from each other.

9. A method of manufacturing a display panel, the method comprising:
forming a light-emitting electrode on and above a substrate;
forming a first intermediate layer on and above the light-emitting electrode, the first intermediate layer comprising a metal oxide;
forming a bank layer on and above the first intermediate layer, the bank layer covering an edge of the first intermediate layer, the bank layer comprising an opening overlapping the light-emitting electrode and the first intermediate layer;
forming, in the opening, a second intermediate layer overlapping the first intermediate layer;
forming a quantum dot light-emitting layer on the second intermediate layer; and
forming a counter electrode on the quantum dot light-emitting layer,
wherein a density of the first intermediate layer is different from a density of the second intermediate layer.

10. The method of claim 9, wherein forming the second intermediate layer comprises an inkjet printing process.

11. The method of claim 9, wherein the second intermediate layer comprises an additive not present in the first intermediate layer.

12. The method of claim 9, wherein the metal of the metal oxide comprises at least one of Zn, Ti, Zr, Sn, W, Ta, Ni, Mo, Cu, Mg, Co, Mn, Y, and Al.

13. The method of claim 9,
wherein the metal oxide is expressed by Chemical Formula 1 below:

$M_aO_b$     Chemical Formula 1 wherein M denotes Zn, Ti, Zr, Sn, W, Ta, Ni, Mo, or Cu, and
wherein a and b independently denote an integer of 1 or 5.

14. The method of claim 9,
wherein the metal oxide is expressed by Chemical Formula 2 below:

$Zn_{(1-c)}M'_cO$     Chemical Formula 2 wherein M' denotes at least one of Mg, Co, Ni, Zr, Mn, Sn, Y, and Al, and c denotes a number greater than 0 and less than or equal to 0.5.

15. An electronic device including a display panel, wherein the display panel comprises:
a substrate;
light-emitting electrodes on and above the substrate, the light-emitting electrodes respectively disposed in first, second, and third emission areas;
first intermediate layers on and above the light-emitting electrodes, the first intermediate layers respectively disposed in the first, second, and third emission areas and respectively overlapping the light-emitting electrodes;
a bank layer on and above the first intermediate layers, the bank layer covering an edge of each of the first intermediate layers, the bank layer comprising openings respectively overlapping the first intermediate layers;
a counter electrode disposed on and above the bank layer and covering the light-emitting electrodes;
quantum dot light-emitting layers disposed below the counter electrode and respectively disposed in the first, second, and third emission areas; and
a second intermediate layer between the first intermediate layer in the first emission area and the quantum dot light-emitting layer in the first emission area, wherein
the second intermediate layer is disposed in an opening of the bank layer corresponding to the first emission area, the opening being one of the openings of the bank layer,
wherein a density of the first intermediate layer disposed in the first emission area and a density of the second intermediate layer disposed in the first emission area are different from each other.

16. The electronic device of claim 15, wherein:
the quantum dot light-emitting layer disposed in the first emission area comprises a quantum dot light-emitting material configured to emit red or green light; and
a thickness of the first intermediate layer disposed in the first emission area is sized according to a resonance distance of blue light.

17. The electronic device of claim 15, wherein:
each of the light-emitting electrodes comprises a cathode electrode;
the counter electrode comprises an anode electrode; and
each of the first intermediate layers and the second intermediate layer comprises an electron transport layer or an electron injection layer.

18. The electronic device of claim 15, wherein:
each of the first intermediate layers comprises a metal oxide; and
the metal of the metal oxide comprises at least one of Zn, Ti, Zr, Sn, W, Ta, Ni, Mo, Cu, Mg, Co, Mn, Y, and Al.

19. The electronic device of claim 18,
wherein the metal oxide is expressed by Chemical Formula 1 below:

$M_aO_b$     Chemical Formula 1 wherein M denotes Zn, Ti, Zr, Sn, W, Ta, Ni, Mo, or Cu, and wherein a and b independently denote an integer of 1 or 5.

20. The electronic device of claim 18, wherein:

wherein the metal oxide is expressed by Chemical Formula 2 below:

$$Zn_{(1-c)}M'_cO \qquad \text{Chemical Formula 2}$$

wherein M' denotes at least one of Mg, Co, Ni, Zr, Mn, Sn, Y, and Al, and c denotes a number greater than 0 and less than or equal to 0.5.

21. An electronic device including a display panel, wherein the display panel comprises:

a substrate;

a cathode electrode on and above the substrate;

a first inorganic electron layer on and above the cathode electrode;

a bank layer on and above the first inorganic electron layer, the bank layer covering an edge of the first inorganic electron layer, the bank layer comprising an opening overlapping the cathode electrode and the first inorganic electron layer;

a second inorganic electron layer disposed in the opening and overlapping the first inorganic electron layer;

a quantum dot light-emitting layer on the second inorganic electron layer; and an anode electrode on the quantum dot light-emitting layer, wherein the first inorganic electron layer comprises a metal oxide, the metal oxide is expressed by Chemical Formula 2 below:

$$Zn_{(1-c)}M'_cO \qquad \text{Chemical Formula 2}$$

wherein M' denotes at least one of Mg, Co, Ni, Zr, Mn, Sn, Y, and Al, and c denotes a number greater than 0 and less than or equal to 0.5.

* * * * *